United States Patent [19]

Schlupp

[11] Patent Number: 4,518,981
[45] Date of Patent: May 21, 1985

[54] MERGED PLATINUM SILICIDE FUSE AND SCHOTTKY DIODE AND METHOD OF MANUFACTURE THEREOF

[75] Inventor: Ronald L. Schlupp, Los Gatos, Calif.

[73] Assignee: Advanced Micro Devices, Inc., Sunnyvale, Calif.

[21] Appl. No.: 320,368

[22] Filed: Nov. 12, 1981

[51] Int. Cl.³ .................... H01L 29/48; H01L 27/02; H01L 29/40; H01L 23/48
[52] U.S. Cl. ........................ 357/71; 357/15; 357/51; 357/53; 357/67
[58] Field of Search .............. 357/67 S, 59, 71 S, 357/15, 51, 52, 53; 365/96

[56] References Cited

U.S. PATENT DOCUMENTS

| | | | |
|---|---|---|---|
| 3,777,364 | 12/1973 | Schinello et al. | 357/71 S |
| 4,009,481 | 2/1977 | Reimdl | 357/15 |
| 4,135,295 | 1/1979 | Price | 357/67 S |
| 4,161,745 | 7/1979 | Slob | 357/68 |
| 4,229,757 | 10/1980 | Moussie | 357/59 |
| 4,259,680 | 3/1981 | Lepselter et al. | 357/67 S |
| 4,267,633 | 5/1981 | Seiler | 357/71 |
| 4,305,200 | 12/1981 | Fu et al. | 357/59 |
| 4,329,706 | 5/1982 | Crowder et al. | 357/67 S |
| 4,356,622 | 11/1982 | Widmann | 357/67 S |
| 4,374,700 | 2/1983 | Scott et al. | 357/67 S |

FOREIGN PATENT DOCUMENTS

| | | | |
|---|---|---|---|
| 54-21280 | 2/1979 | Japan | 357/15 |
| 55-27645 | 2/1980 | Japan | 357/67 S |
| 56-36159 | 4/1981 | Japan | 357/15 |
| 2005078 | 4/1979 | United Kingdom | |

OTHER PUBLICATIONS

S. P. Murarka, "Refractory Silicides For Integrated Circuits", *Journal of Vacuum Science and Technology*, vol. 17 (1980) pp. 775–792.

A. P. Ho et al., "Self-Aligned Process For Forming Metal-Silicide And Polysilicon Composite Base Contact", *IBM Technical Disclosure Bulletin*, vol. 22 (1980) 5336–5338.

*Primary Examiner*—Andrew J. James
*Assistant Examiner*—J. Carroll
*Attorney, Agent, or Firm*—Patrick T. King; J. Vincent Tortolano; Eugene H. Valet

[57] ABSTRACT

A merged platinum silicide fuse and Schottky diode structure and method of manufacturing the merged structure is presented. The merged structure is formed by an insulating layer having an aperture over a silicon substrate. A shaped layer of polysilicon lies on the insulating layer and contacts the substrate through the aperture; a layer of platinum silicide in the same shape as the polysilicon layer covers the polysilicon layer. The region of polysilicon - PtSi layers over the substrate contact forms a Schottky diode and the region on the insulating layer forms the fuse. This merged structure has superior Schottky diode electrical characteristics and is more compact compared to prior art structures.

17 Claims, 13 Drawing Figures

MERGED PLATINUM SILICIDE FUSE AND SCHOTTKY DIODE AND METHOD OF MANUFACTURE THEREOF

BACKGROUND OF THE INVENTION

1. Field of the Invention

This invention relates to integrated circuits, and, more particularly, to fuses useful in programming integrated circuits.

2. Prior Art

In programmable read only memories (PROMs), various materials are used for fuses, which are melted or "blown" to program the integrated circuit device. Such materials include nickel-chromium alloys, polysilicon and refractory metal silicide. Also as part of the circuitry of the device, some PROMs typically have Schottky diodes formed by a metal contact to the semiconductor substrate on which the integrated circuit is manufactured. Two patents disclosing platinum silicide fuses and Schottky diode devices have been issued to William L. Price and assigned to the present assignee; the first patent is U.S. Pat. No. 4,042,950, entitled "Platinum Silicide Fuse Links for Integrated Circuit Devices", issued Aug. 16, 1977, and the second, U.S. Pat. No. 4,135,295, entitled "Process of Making Platinum Silicide Fuse Links for Integrated Circuit Devices", issued Jan. 23, 1979. These patents disclose a method and structure of manufacturing platinum silicide fuses on a silicon substrate. The final product has a platinum silicide fuse having one end connected by a first metal interconnection line to other parts of the integrated circuit. The other end of the fuse is connected by a metal interconnection line to a Schottky diode, which is formed by a platinum silicide contact to the lightly doped substrate below.

The required metal interconnection between the fuse and the Schottky diode generates two problems. First, it limits the minimum area need to design a fuse cell (a fuse and a Schottky diode). Second, the manufacturing steps needed to metallize a Schottky diode degrade its forward and reverse electrical characteristics. This happens even if the metallization is allowed to overlap the Schottky, diode to form a field plate around the diode.

In a Schottky diode fuse array, reverse Schottky leakage is important because during the programming of a fuse every Schottky diode with the exception of the one associated with the fuse to be programmed is reverse-biased. Current which is leaked by the reverse-biased Schottky diodes is lost from the current available to program the selected fuse. In a large PROM single diode leakages are multiplied to quite large array current leakage, anywhere in range of 5–50 mA. In order to not lower programming yields, these leakages must be compensated for. This requires increasing the peripheral circuitry which, in turn, increases die size, an undesirable result.

The present invention is a significant improvement over this prior art.

SUMMARY OF THE INVENTION

The present invention merges the platinum silicide fuse and the Schottky diode so that a more compact structure is presented, with improved reverse-biased electrical characteristics. Furthermore, various embodiments of the merged fuse and Schottky diode permit a choice of structures having various forward-biased electrical characteristics.

The present invention provides for a merged fuse and Schottky diode device in an integrated circuit formed at the surface of a semiconductor substrate comprising an insulating layer having a opening therethrough over the substrate surface, a silicon layer on the insulating surface and the aperture, the silicon layer defined and having a first portion on the insulating layer and a second portion in contact with the substrate through the aperture, and a metal silicide layer over the silicon layer having substantially the same shape as the silicon layer so that a first portion of the metal silicide layer over the first portion of the silicon layer has a cross sectional dimension so as to open by the application of an electrical voltage greater than a preselected electric voltage and a second portion of the metal silicide layer over the second portion of the silicon layer forms a Schottky diode therewith. With the silicon layer material comprising polysilicon the Schottky diode is formed by the contact of the metal silicide layer with the polysilicon material in the area of the aperture.

The reverse electrical breakdown characteristics of the Schottky diode formed can be greatly improved by having the silicon layer with a third portion extending from the second portion over the periphery of the insulating layer aperture onto the insulating layer with the metal silicide layer thereover to act as a field plate for the Schottky diode.

BRIEF DESCRIPTION OF THE DRAWINGS

A clear understanding of the invention may be obtained from the Detailed Description and by reference to the following drawings.

DETAILED DESCRIPTION

Figure 1:
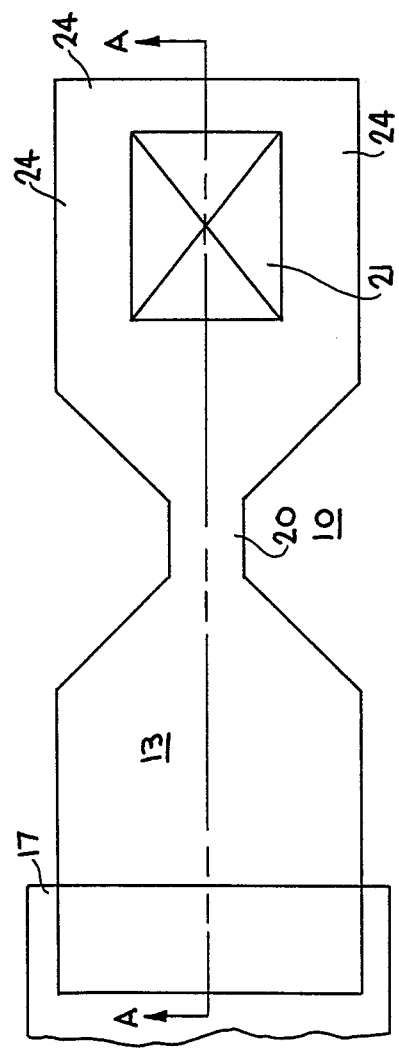
FIG. 1 is a plan view of one embodiment of the present invention.

A top or plan view of a merged silicide fuse and Schottky diode device is shown in FIG. 1. Formed on a semiconductor substrate, typically, silicon, the merged device has a general shape like that of an interconnecting line of an integrated circuit. At least one portion of the device must be cross-sectioned so small that a high current would be concentrated for the fuse of melt. A narrowed portion 20 is that portion in FIG. 1. A second portion 21, marked with a "X", indicates the region of the Schottky diode. FIGS. 3A, 3B, 3C and 3D illustrate some of the steps in manufacturing the device shown in FIG. 1 and FIG. 2.

Figure 3A:
FIGS. 3A, 3B, 3C and 3D are illustrations of the various steps in the process to manufacture the device shown in FIG. 1.
Figure 3B:
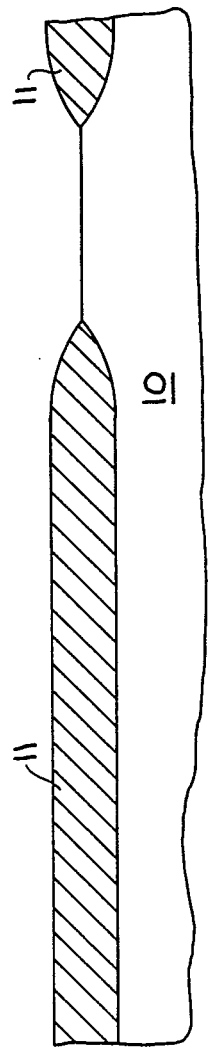

FIG. 3A shows the manufacturing step in preparation of creating a selectively grown thick field oxide. The substrate 10 is covered by a preliminary silicon dioxide layer 11A and a portion of a nitride layer 15 is placed over the desired contact region by well-known masking and etching techniques. The substrate 10 is placed at an oxidizing atmosphere and heated so that the unmasked portions of the preliminary oxide layer 11A will grow to the desired thicknesses. Subsequently, the nitride layer 15 is stripped off and the remaining thin oxide layer thereunder is removed. FIG. 3B illustrates this.

An alternative to this step is to simply grow the field oxide and mask and etch an aperture where the contact region is desired.

Figure 3C:
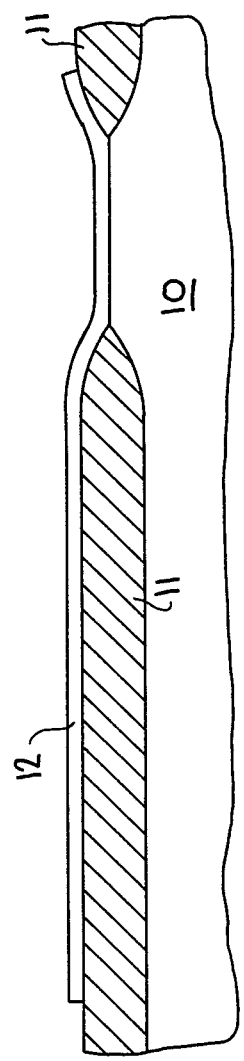

The substrate 10 and covering oxide layer 11 with the contact aperture are then completely covered with a polysilicon layer 12 with a thickness of approximately 1000 Angstroms. The layer 12 is defined by masking and etching into the shape illustrated by FIG. 1 with a general configuration like that of an interconnecting line of an integrated circuit with a narrowed portion 20 and a contact region 21. FIG. 3C illustrates the defined layer of polycrystalline silicon 12.

Figure 2:
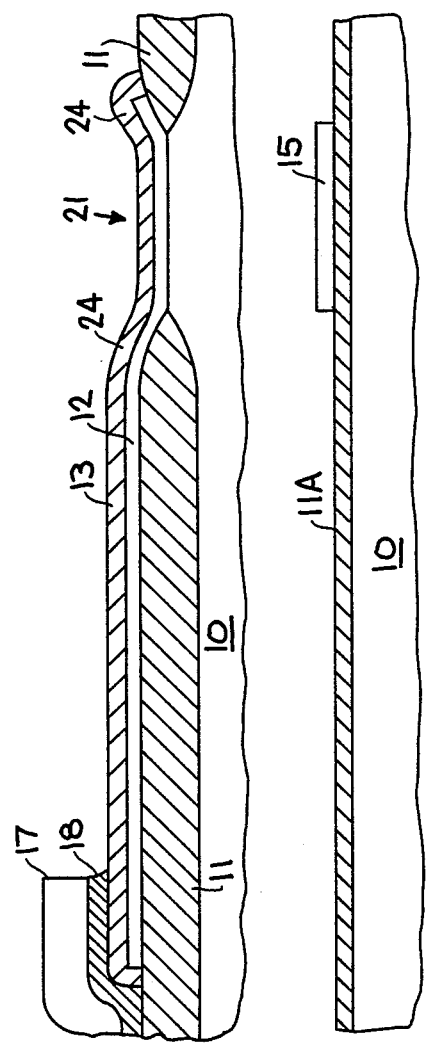
FIG. 2 is a cross sectional view of the device shown in FIG. 1 along line A—A.
Figure 3D:
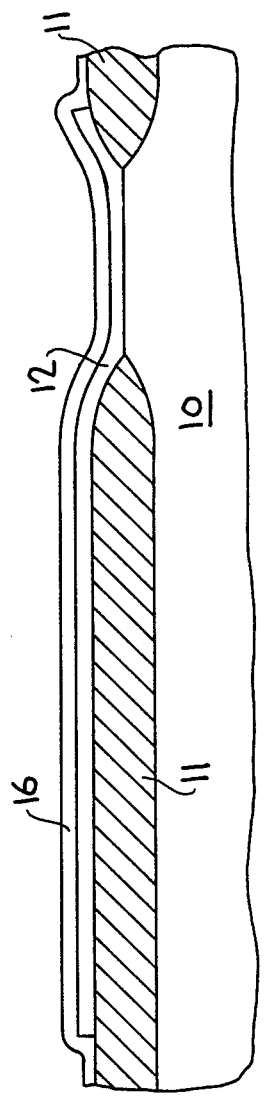

The entire substrate 10 with the polysilicon layer 12 and the insulating layer 11 is then completely covered with a platinum layer 16, optimally about 400 Angstroms thick. A standard technique is to sputter the platinum onto the surface. FIG. 3D illustrates the platinum covered device. Subsequent to this, the platinum layer 16 and the polysilicon layer 12 are sintered by heating in a range of 500° to 600° C. During the sintering process, the polysilicon atoms of the layer 12 and the platinum atoms of the layer 16 diffuse into each other forming a layer 13 of platinum silicide in place of the platinum layer 16 with substantially the same shape as the polysilicon layer 12."FIG. 2 shows the resulting platinum silicide layer 13 and the remaining layer 12A of unsintered polysilicon." Silicon atoms which diffuse entirely through the platinum layer 16 film oxidize to form a protective oxide on the platinum silicide. Because this oxide does not form readily if there is not an excess of silicon the polysilicon layer 12 must be thicker in relation to the platinum layer 16 to supply an excess of silicon over platinum. "Since the polysilicon layer 12 is already defined and does not completely cover the surface of the substrate 10, the platinum layer 16 regions which do not cover the polysilicon remain unsintered." The unsintered portions of the layer 16 are removed by placing the entire substrate 10 into a solution of aqua regia which etches the platinum but does not affect the silicon dioxide protected platinum silicide. The silicon dioxide covering the platinum silicide must be removed with a chemical or sputter etch operation and then the device metallized and patterned in a masking operation to form the desired interconnections. The metal line from the fuse cell, the fuse and Schottky diode, to the rest of the integrated circuit is formed by a double layer of titanium-tungsten alloy 18 and aluminum 17. The titanium-tungsten layer 18 is used to maintain the integrity of the aluminum layer 17 which would react with the silicide layer 13 if the intervening TiW layer 18 were not present. The result is the device shown in FIGS. 1 and 2.

The conductivity factors for the substrate and each layer are dependent upon the nature of the device being constructed and should be determined in accordance with common practice for the fabrication of integrated circuits, such as by reference to *Device Electronics for Integrated Circuits,* Muller & Kamins, copyright 1977, John Wiley & Sons, or *Physics of Semiconductor Devices,* Sze, copyright 1981, John Wiley & Sons.

Figure 9A:
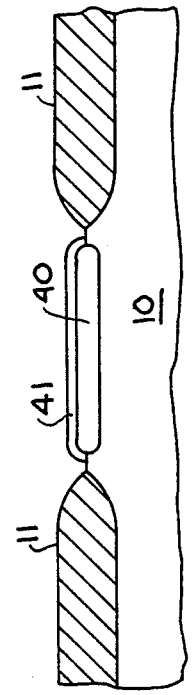
FIGS. 9A and 9B illustrate some problems of the Schottky diodes in the prior art.

The significant features and advantages of the polysilicon covered Schottky diode are best shown by comparison with the fabrication of a nonpolysilicon covered Schottky diode of the prior art. FIG. 9A shows a detailed view of a nonpolysilicon covered Schottky diode after the sintering and aqua regia etching operations. With no intervening polysilicon layer 12 as discussed above, the platinum layer is placed directly in contact with the silicon substrate 10. Sintering occurs between the substrate and the platinum layer, to form a platinum silicide layer 40, defined after the aqua regia etching step removes the unsintered platinum material. Layer 41 is the protective silicon dioxide layer on top of the platinum silicide layer 40.

During the etching step to remove the oxide layer 41 present on top of the platinum silicide layer 40 for a clean contact to metal, some oxide (200–400 Angstroms) is also removed from field oxide layer 11, in particular around the silicide layer 40. The resulting exposed silicon, region 42, surrounding the platinum silicide Schottky contact layer 40 forms part of the depletion region for the platinum silicide Schottky. Also this region allows the formation of a second Schottky diode electrically in parallel with the platinum silicide Schottky diode when the exposed silicon substrate 10 is contacted at the region 42 by the metal line 43 which connects the Schottky diode to a PtSi fuse (not shown). The metal line 43 represent the double metal layers of TiW and Al as discussed previously.

The effect of having the exposed depletion region or the peripheral Schottky diode in parallel with the platinum silicide Schottky diode is to degrade the measured electrical characteristics. The degradation being worst the more gradual the taper of the oxide layer 11 toward the contact region, or the larger the ratio of the periphery to the Schottky contact area. Thus in processes utilizing tapered oxide contacts, for example selective oxidation, these effects can severely degrade the Schottky diodes.

In a polysilicon covered Schottky diode device as in FIG. 2, the thin oxide regions are protected by the polysilicon 12A and platinum silicide 13 layers and the device is not degraded during the removal of the protective oxide. Furthermore, the platinum silicide layer 13 on the thin oxide regions forms an excellent field plate 24 for the Schottky. The device shown in FIG. 1 has very good reverse leakage. The forward voltage has no peripheral component but does increase with the thickness of polysilicon remaining under the platinum silicide.

Figure 4:
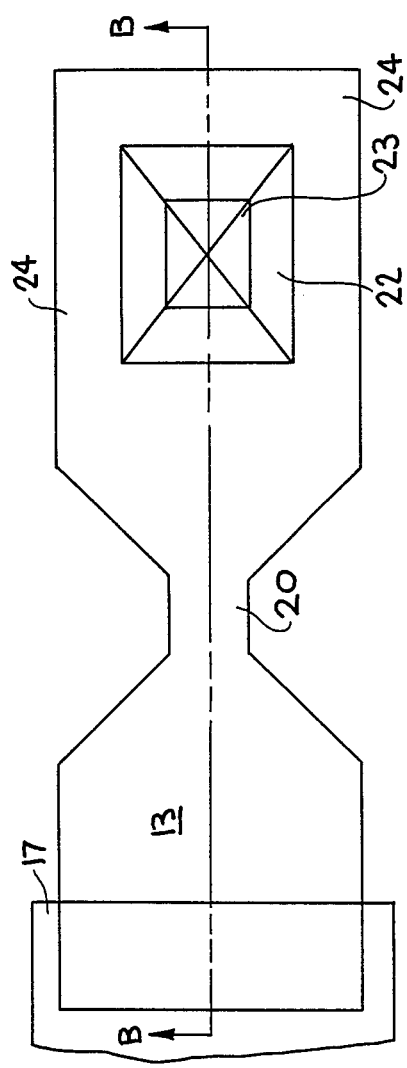
FIG. 4 is a plan view of another embodiment of the present invention.
Figure 5:
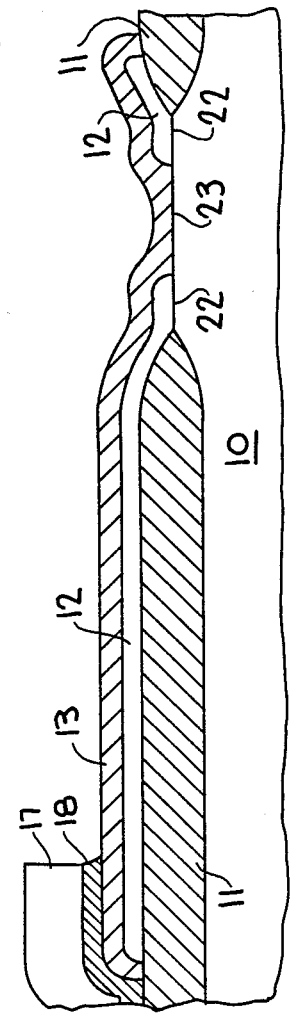
FIG. 5 is a cross sectional view of FIG. 4 along line B—B.
Figure 6:
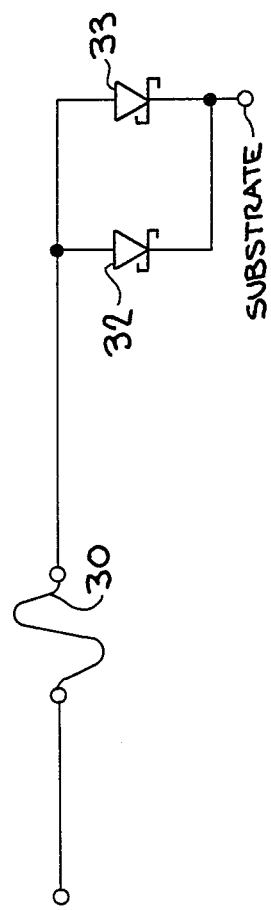
FIG. 6 is a circuit representation of the device in FIG. 4.
Figure 9B:
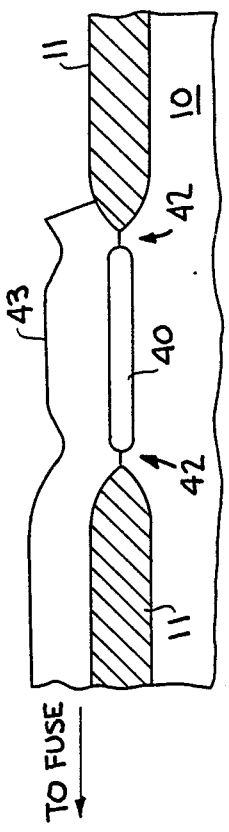

Another embodiment of the present invention is a platinum silicide fuse merged with two parallel Schottky diodes with differing operational characteristics. FIGS. 4 and 5 illustrate the embodiment. Unlike the problematical Schottky diode in the prior art, shown in FIGS. 9A and 9B the two parallel Schottky diodes have been intentionally designed. The device has the narrow portion of the silicide layer 13 and underlying polysilicon layer 12A for the fuse and two contact regions, 22 and 23. The contact region 22 forms the same polysilicon based Schottky diode as disclosed above. In contrast, the platinum silicide layer 13 contacts the single crystal substrate 10 at the region 23. This forms a more standard metal silicide-single crystal silicon Schottky diode which has a normal PtSi forward voltage as compared to the polysilicon based Schottky diode. FIG. 6 represents the circuit schematic of this merged structure. The fuse 30 corresponds to the narrow region 20 in FIGS. 4 and 5 with the Schottky diodes 32 and 33 representing the different Schottky diodes at the contact regions 22, 23. This structure allows normal platinum silicide forward voltages at low currents and the improved reverse leakages of the polysilicon covered Schottky diodes.

In the manufacturing process for this device structure the step illustrated in FIG. 3C is changed so that the defined polycrystalline layer 12 does not completely cover the exposed substrate 10 but does so only partially. The metal layer 16 is then sputtered to completely cover the underlying structures with a portion contacting the substrate 10 directly. Upon sintering, the region of the metal layer 16 near the contact at the substrate has much of its interdiffusion of silicon occurring with the substrate 10, rather than the polycrystalline layer 12.

Figure 7:
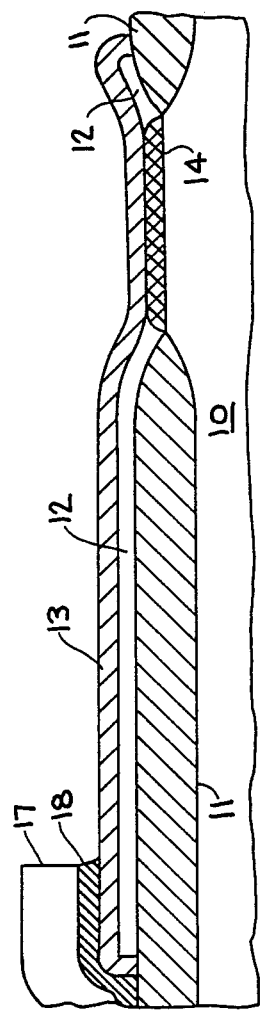
FIG. 7 shows a cross sectional view of another embodiment in which a laser heating step has been used.

Still another embodiment of the invention is shown in FIG. 7. This structure is achieved by adding an extra step before or after that shown in FIG. 3C. The polysilicon layer 12 is exposed to laser light so that the region of the polycrystalline layer 12 is melted and recrystallized after assuming the single crystal orientation of the substrate 10. This recrystallized region is shown as a region 14 in FIG. 7. The process thereafter proceeds as discussed previously. The resulting structure has a Schottky diode which has the silicide layer in contact with a single crystal silicon, i.e., the region 14 which has become an extension of the substrate 10, so that a Schottky diode having forward operational characteristics of single crystal silicon is formed while maintaining improved reverse characteristics due to the absence of an exposed oxide edge surrounding the Schottky diode.

Figure 8:
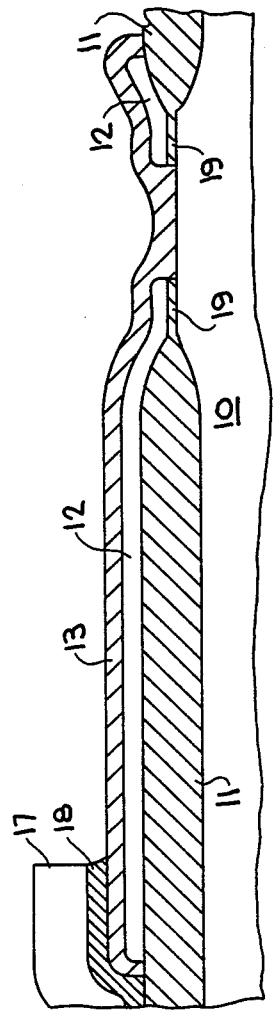
FIG. 8 shows a cross sectional view of still another embodiment of the present invention.

FIG. 8 illustrates another structure of the present invention in which the platinum silicide fuse is merged with a single crystal Schottky diode. In this case, a thin layer (approximately 300 Angstroms) of oxide 19 partially covers the aperture in the oxide layer 11. The polycrystalline layer 12 is defined so that it remains on the thin oxide layer 19 but does not contact the underlying substrate 10. The metal silicide layer 13 is formed and defined as discussed previously with the portion in contact with substrate 10 forming the Schottky diode.

This structure gives undegraded platinum silicide forward voltages and, because of the field plating effect of the platinum silicide on the thin oxide, improved reverse leakages. This structure requires platinum thicknesses of greater than 1.5 times the thin oxide thickness to have reliable contact from poly to single crystal silicon.

To manufacture this particular structure the exposed portion of the substrate 10 shown in FIG. 3B of the manufacturing process can be reoxidized to form a thin oxide layer thereover or the thin oxide layer 11A under the nitride layer 15 is simply not removed. The polysilicon layer 12 can then be defined by masking and etching so as to not completely cover the contact region. Using the defined polysilicon as a mask the underlying thin oxide can be etched away to leave the polysilicon layer 12 and the thin oxide layer 19 as shown in FIG. 8. The platinum metallization and sintering steps is performed as discussed previously.

Accordingly, while the invention has been particularly shown and described with reference to the preferred embodiments, it would be understood by those skilled in the art that changes in form and details may be made therein without departing from the spirit of the invention. It is therefore intended that an exclusive right be granted to the invention as limited only by the metes and bounds of the appended claims.

I claim:

1. In an integrated circuit formed at a surface of a semiconductor substrate, a merged fuse and Schottky diode device comprising:
   an insulating layer having an aperture therethrough over said substrate surface,
      a silicon layer on said insulating layer and said aperture, said silicon layer shaped as an interconnecting line of said integrated circuit and having a first portion on said insulating layer and a second portion in contact with said substrate through said aperture, and
      a metal silicide layer over said silicon layer having substantially the same shape as said silicon layer so that a first portion of said metal silicide layer over said first portion of said silicon layer has a cross sectional dimension so as to open by the application of electrical voltage greater than a preselected electric voltage and a second portion of said metal silicide layer over said second portion of said silicon layer forms a Schottky diode at said aperture.

2. The device as in claim 1 wherein said silicon layer comprises polysilicon material.

3. The device as in claim 2 wherein said silicon layer has a third portion extending from said second portion over the periphery of said insulating layer aperture onto said insulating layer, said third portion having said metal silicide layer thereover, whereby breakdown characteristics of said Schottky diode are improved.

4. The device as in claim 3 wherein said metal silicide layer is a sintered layer.

5. The device as in claim 4 where in said metal comprises platinum.

6. The device as in claim 2 wherein said metal silicide layer is in contact with said substrate through said aperture whereby a second Schottky diode is formed.

7. The device as in claim 6 wherein said metal silicide layer is a sintered layer.

8. The device as in claim 7 wherein said metal comprises platinum.

9. The device as in claim 1 wherein said silicon layer includes single crystal material.

10. The device as in claim 9 wherein said second portion of said silicon layer in contact with said substrate is single crystal silicon.

11. The device as in claim 10 wherein said metal silicide layer is a sintered layer.

12. The device as in claim 11 wherein said silicon layer has a third portion extending from said second portion over the periphery of said insulating layer apeture onto said insulating layer, said third portion having said metal silicide layer thereover, whereby breakdown characteristics of said Schottky diode are improved.

13. The device as in claim 11 wherein said metal comprises platinum.

14. In an integrated circuit formed at a surface of a semiconductor substrate, a merged fuse and Schottky diode device comprising
   an insulating layer having an opening therethrough over said substrate surface,
      a polycrystalline silicon layer on said insulating layer, said polycrystalline layer shaped as an interconnecting line of said integrated circuit and having a narrowed first portion and a second portion at the periphery of said opening, and a metal silicide layer over said polycrystalline layer having substantially the same shape as said polycrystalline layer so that a first portion of said metal silicide layer over said narrowed first portion of said polycrystalline layer has a cross sectional dimension so as to open by the application of electrical voltage greater than a preselected electric voltage and a second portion of said metal silicide layer over said second portion of said polycrystalline layer extends over said periphery to contact said substrate whereby a Schottky diode is formed with said substrate.

15. A device as in claim 14 wherein that portion of said insulating layer below said second portion of said polycrystalline layer is much thinner than the portion of said insulating layer below said narrowed first portion of said polycrystalline layer.

16. A device as in claim 15 wherein said metal silicide layer is a sintered layer.

17. A device as in claim 16 wherein said metal comprises platinum.

* * * * *